United States Patent [19]
Yamazaki

[11] Patent Number: 5,847,444
[45] Date of Patent: Dec. 8, 1998

[54] SEMICONDUCTOR DEVICE WITH REDUCED ASPECT RATIO CONTACT HOLE

[75] Inventor: Yasushi Yamazaki, Tokyo, Japan

[73] Assignee: NEC Corporation, Tokyo, Japan

[21] Appl. No.: 705,840

[22] Filed: Aug. 30, 1996

[30] Foreign Application Priority Data

Sep. 14, 1995 [JP] Japan .................................. 7-260985

[51] Int. Cl.$^6$ .................................................. H01L 23/58
[52] U.S. Cl. ....................... 257/635; 257/638; 257/641; 257/644; 257/650
[58] Field of Search .................................. 257/635, 638, 257/641, 644, 650

[56] References Cited

U.S. PATENT DOCUMENTS

| | | | |
|---|---|---|---|
| 4,795,722 | 1/1989 | Welch et al. | 437/192 |
| 5,186,745 | 2/1993 | Maniar | 106/287.16 |
| 5,314,843 | 5/1994 | Yu et al. | 437/225 |
| 5,378,318 | 1/1995 | Weling et al. | 156/662 |
| 5,457,073 | 10/1995 | Ouellet | 437/231 |
| 5,606,193 | 2/1997 | Ueda et al. | 257/390 |

*Primary Examiner*—Olik Chaudhuri
*Assistant Examiner*—Douglas A. Wille
*Attorney, Agent, or Firm*—Young & Thompson

[57] ABSTRACT

A semiconductor device has a memory cell area which contains a component having a height and a peripheral circuit area free of a component having a height. The first area includes a interlayer insulating film comprising a first interlayer film as an uppermost insulating film. The second area includes an interlayer insulating film comprising the first interlayer film and a second interlayer film disposed directly on the first interlayer film and having a chemical mechanical polishing rate greater than the first interlayer film. The interlayer insulating film in the memory cell area has a surface higher than the interlayer insulating film in the peripheral circuit area.

8 Claims, 4 Drawing Sheets

Memory Cell ←→ Peripheral Circuit

SEMICONDUCTOR DEVICE WITH REDUCED ASPECT RATIO CONTACT HOLE

BACKGROUND OF THE INVENTION

1. Field of the Invention

The present invention relates to a semiconductor device including an area which contains a component having a height and another area free of such a component and a method of manufacturing such a semiconductor device, and more particularly to the structure of an interlayer insulating film on surface topography and a method of manufacturing such an interlayer insulating film.

2. Description of the Related Art

One known example of semiconductor device including an area which contains a component having a height and another area free of such a component is a dynamic random-access memory (DRAM) device having stacked capacitors as storage cells. The DRAM device suffers a problem in that the capacitance per storage cell decreases as the degree of integration thereof increases and the size of the components thereof decreases. To solve such a problem, it has been customary to increase the height of the lower electrode of each capacitor to increase the surface area. However, the increased height of the lower electrode of each capacitor results in an increase in the step between memory cells and peripheral circuits, making it difficult to form metallic interconnections on those memory cells and peripheral circuits according to photolithography.

There has heretofore been known a process of reflowing a BPSG (borophophosilicate glass) film for LSI planarization. While this process is capable of improving local planarization, however, it fails to reduce the absolute step between cell plates and peripheral surfaces in DRAM devices. Therefore, semiconductor devices with large steps existing between memory cells and peripheral circuits have suffered a poor level of photolithographic processing accuracy because those large steps are too large for the focusing margin of photolithography. In an attempt to planarize global surface topography, a polishing technique called CMP (Chemical Mechanical Polishing) has recently been employed in the fabrication of various semiconductor devices.

One conventional structure of a DRAM device fabricated using the CMP process and a method of manufacturing such a DRAM device will be described below.

FIGS. 1(a) through 1(c) and FIG. 2 of the accompanying drawings shows in fragmentary cross section conventional successive steps of fabricating a stacked-type DRAM device. As shown in FIG. 1(a), an n-type MOS (metal-oxide-semiconductor) transistor having a gate electrode 2 is formed in a memory cell area on a p-type silicon substrate 1 and a CMOS (complementary metal-oxide-semiconductor) transistor is formed in a peripheral circuit area on the p-type silicon substrate 1. The process of fabricating the MOS transistor and the CMOS transistor is the same as the process of fabricating general semiconductor devices, and will not be described in detail below. After the CMOS transistor is formed, a first interlayer insulating film 3 of $SiO_2$ is deposited to a thickness of about 400 nm on the surface formed so far. Thereafter, a capacitance contact hole 4 is opened in the cell node of the memory cell according to photolithography and dry etching. At this time, the insulating film on the substrate 1 in the peripheral circuit area has a thickness of about 400 nm. Then, a polysilicon film is grown to a thickness of about 500 nm on the interlayer insulating film 3, and then patterned into the shape of a capacitive lower electrode.

Thereafter, the polysilicon film is doped with phosphorus to produce a capacitive lower electrode 5 of conductive polysilicon. A capacitive insulating film 6 is deposited on the capacitive lower electrode 5, after which a polysilicon film is grown to a thickness of about 300 nm on the surface formed so far according to low-pressure CVD (chemical vapor deposition). The polysilicon film is doped with phosphorus to produce an n-type polysilicon film.

The n-type polysilicon film is patterned into a plate electrode 7 according to photolithography and dry etching. At this time, the step between the memory cell area and the peripheral circuit area has a height of 800 nm or greater.

Then, as shown in FIG. 1(b), a BPSG film 9 is grown to a thickness of about 1.5 μm on the surface formed so far according to low-pressure CVD or atmospheric-pressure CVD, and then reflowed.

The BPSG film 9 is then polished by a CMP device until a BPSG film having a thickness of about 400 nm is left on the capacitive plate in the memory cell. The entire surface is now planarized completely, so that any step G between the memory cell area and the peripheral circuit area is substantially nil. At this time, a BPSG film having a thickness of about 1.2 μm is left in the peripheral circuit area. Consequently, the insulating film on the substrate has a thickness of about 1.6 μm.

Subsequently, as shown in FIG. 2, an interconnection contact hole 11 having a diameter of about 0.6 μm is opened at a desired position in the peripheral circuit area according to photolithography and dry etching. Since the interconnection contact hole 11 has a depth of about 1.6 μm, its aspect ratio is about 2.7. Then, an aluminum layer is deposited by sputtering and thereafter patterned according to photolithography and dry etching, producing an aluminum interconnection 12. The DRAM device is thus manufactured as shown in FIG. 2.

FIG. 3 of the accompanying drawings shows another conventional structure of a DRAM device prior to the formation of an interconnection contact hole. With the conventional structure shown in FIG. 3, after a memory cell capacitor is formed, an $SiO_2$ film 13 is formed in covering relation to the surface of the capacitor, and a BPSG film 9 is deposited on the $SiO_2$ film 13. The $SiO_2$ film 13 and the BPSG film 9 make up a double-layer film configuration which serves as a second interlayer insulating film 10. The BPSG film 9, which is deposited to a thickness of about 1.3 μm, is planarized according to CMP.

In the above peripheral circuit area shown in FIG. 2, because the aspect ratio of the interconnection contact hole 11 is very large, the step coverage of aluminum is poor, resulting in an increased contact resistance which may possibly cause a contact failure in worst cases. If a barrier metal layer of TiN, Ti, or the like is formed in the interconnection contact hole, then the thickness of the barrier metal layer is not sufficient due to its poor coverage, resulting in an increase in contact resistance and joint leakage. The above drawbacks can be reduced to some extent by reducing the thickness of the interlayer insulating film on the plate electrode 7. However, reducing the thickness of the interlayer insulating film is not effective enough to improve the aspect ratio of the interconnection contact hole 11 in the peripheral circuit area, and is conducive to another problem in that the dielectric-breakdown voltage of the memory cell area is reduced.

Even when the second interlayer insulating film is of the double-layer film configuration composed of the $SiO_2$ film 13 and the BPSG film 9 shown in FIG. 3, if the insulating film which is processed by CMP is of a single layer, then the step G between the memory cell area and the peripheral circuit area is nil after the CMP process. As a consequence, the structure shown in FIG. 3 suffers the same shortcoming as when the interlayer insulating film comprises a single BPSG film.

In semiconductor devices where there is a large step between memory cell and peripheral circuit areas, there is a trade-off between the ease with which metal interconnections are formed on the memory cell and peripheral circuit areas (primarily the focusing margin of photolithography) and the step coverage of the metal interconnection in the contact hole. Therefore, optimum planarization and contact hole depth have to be determined and achieved in order to produce highly reliable semiconductor devices in high yields.

SUMMARY OF THE INVENTION

It is therefore an object of the present invention to optimize planarization and contact hole depth for semiconductor devices.

According to the present invention, there is provided a semiconductor device comprising a first area which contains a component having a height, and a second area free of a component having a height, the first area including a interlayer insulating film comprising a first interlayer film as an uppermost insulating film, the second area including an interlayer insulating film comprising the first interlayer film and a second interlayer film disposed directly on the first interlayer film and having a chemical mechanical polishing rate greater than the first interlayer film, the interlayer insulating film in the first area has a surface higher than the interlayer insulating film in the second area. According to the present invention, there is also provided a method of manufacturing a semiconductor device, comprising the steps of forming a first interlayer film on a semiconductor substrate having a first area which contains a component having a height and a second area free of a component having a height, forming a second interlayer film on the first interlayer film, the second interlayer film having a chemical mechanical polishing rate greater than the first interlayer film, and polishing the first and second interlayer films according to a chemical mechanical polishing process such that the second interlayer film is completely removed from the first area, and the second interlayer film is partly left in the second area.

The above and other objects, features, and advantages of the present invention will become apparent from the following description referring to the accompanying drawings which illustrate examples of preferred embodiments of the present invention.

DETAILED DESCRIPTION OF THE PREFERRED EMBODIMENTS

Figure 1A:
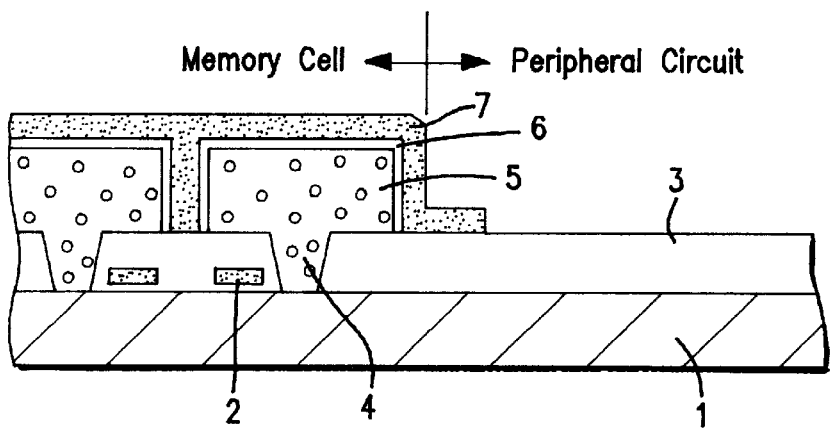
FIG. 1(a) through 1(c) are fragmentary cross-sectional views showing a conventional process of manufacturing a conventional semiconductor device.
Figure 1B:
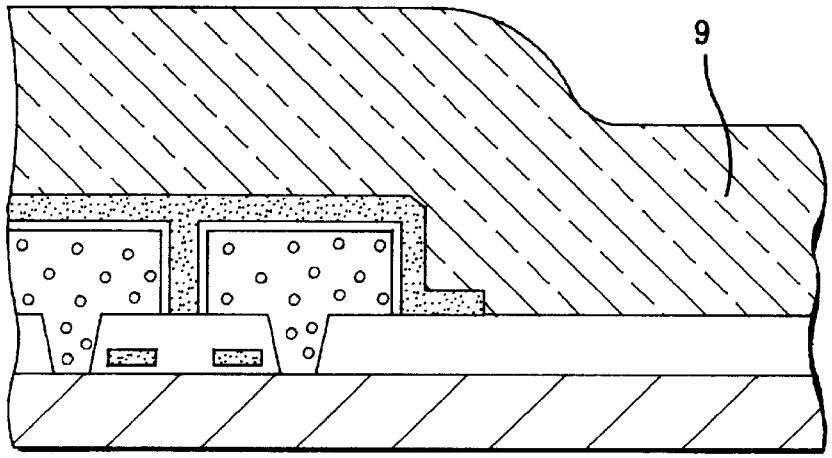
Figure 1C:
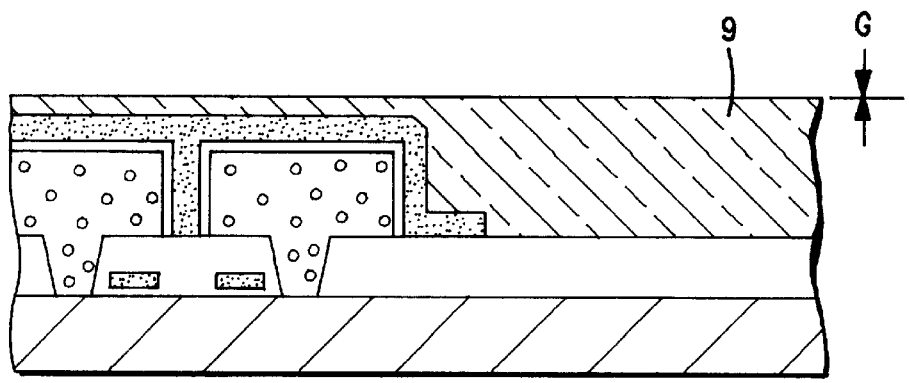
Figure 2:
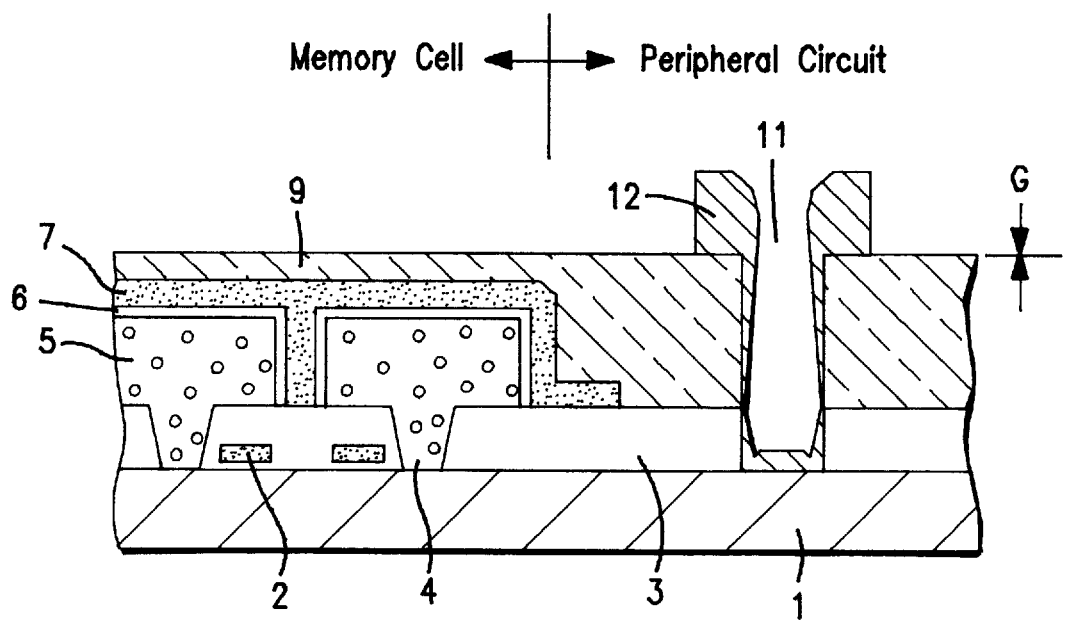
FIG. 2 is a fragmentary cross-sectional view of the conventional semiconductor device manufactured by the conventional process shown in FIG. 1(a) through 1(c)
Figure 3:
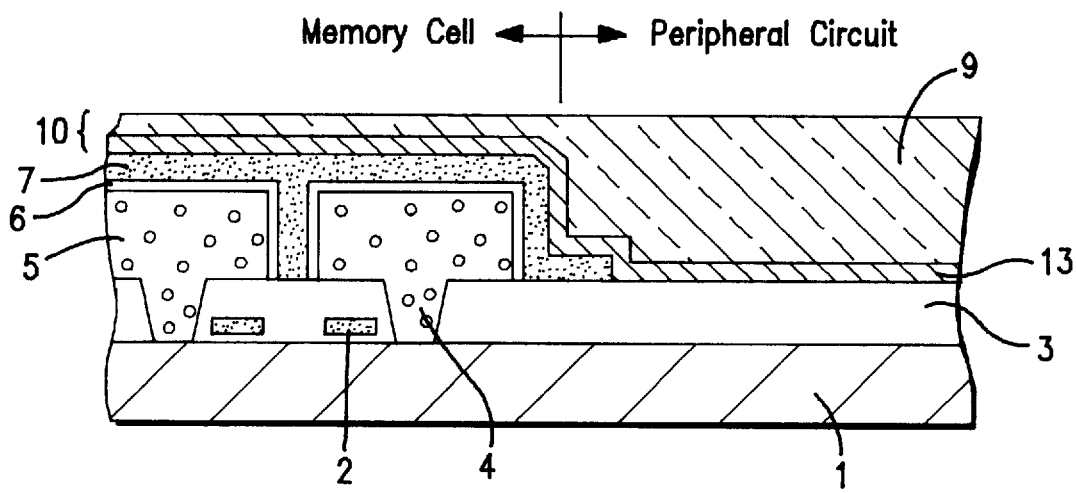
FIG. 3 is a fragmentary cross-sectional view of another semiconductor device.

Like or corresponding parts are denoted by like or corresponding reference numerals throughout views.

Figure 4:
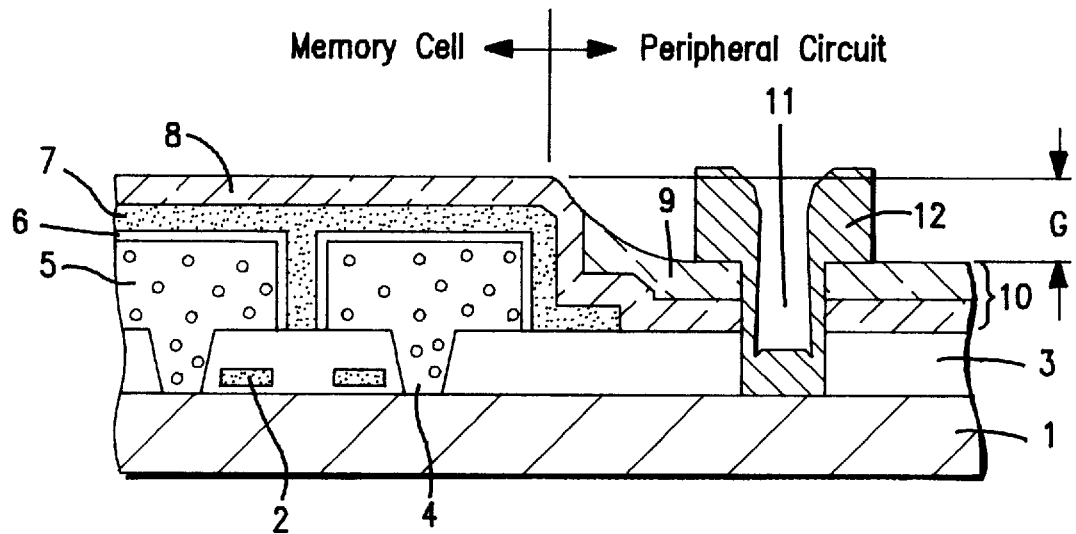
FIG. 4 is a fragmentary cross-sectional view of a semiconductor device according to a first embodiment of the present invention.

FIG. 4 shows in fragmentary cross section a DRAM device having stacked-type capacitors as a semiconductor device according to a first embodiment of the present invention.

In a memory cell area, a gate electrode 2, serving as a transfer gate, of an n-type MOS transistor is formed on a p-type silicon substrate 1 with a gate insulating film interposed therebetween, and covered with a first interlayer insulating film 3 made of $SiO_2$ or the like. The first interlayer insulating film 3 has a capacitive contact hole 4 for exposing therethrough the surface of an n-type diffused layer (not shown) which provides a cell node of a DRAM. A capacitive lower electrode 5 connected to the cell node through the capacitive contact hole 4 is formed on the first interlayer insulating film 3. The capacitive lower electrode 5 has its surface covered with a capacitive insulating film 6, on which a plate electrode 7 is formed. The capacitive lower electrode 5, the capacitive insulating film 6, and the plate electrode 7 jointly make up a storage capacitor of the memory cell.

In a peripheral circuit area, a CMOS (not shown) is formed and has its surface covered with the first interlayer insulating film 3. The first interlayer insulating film 3 and the storage capacitor are covered with a second interlayer insulating film 10. The second interlayer insulating film 10 is of a single-layer film configuration which comprises an NSG (non-doped silicate glass) film 8 in the memory cell area, and is of a double-layer film configuration which comprises an NSG film 8 and a BPSG film 9 in the peripheral circuit area. The second interlayer insulating film 10 is formed by successively depositing the NSG film 8 and the BPSG film 9 and then polishing the BPSG film 9 according to CMP. In the memory cell area, the BPSG film 9 is completely polished off by CMP. In the peripheral circuit area, the BPSG film 9 is polished by CMP such that it partly remains on the NSG film 8. After the polishing process, the step G between the memory cell area and the peripheral circuit area has a dimension which is about half (about 0.4 $\mu$m) the total (about 0.8 $\mu$m) of the height of the capacitive lower electrode 5 and the thickness of the plate electrode 7.

The peripheral circuit area has an interconnection contact hole 11 defined vertically through the second interlayer insulating film 10 and the first interlayer insulating film 3. An aluminum interconnection 12 which is held in contact with the diffused layer on the substrate 1 through the interconnection contact hole 11 is formed on the second interlayer insulating film 10. Since the total thickness of the insulating films on the semiconductor substrate is reduced as described above, the aspect ratio of the interconnection contact hole 11 is reduced, and hence the step coverage of the aluminum interconnection 12 is improved as compared with the conventional structures.

The memory cell area also has an interconnection contact hole and a through hole defined outside of the illustrated area, and an aluminum interconnection which is connected to a lower conductive layer through the interconnection contact hole and the through hole.

A process of manufacturing the DRAM device shown in FIG. 4 will be described below with reference to FIGS. 5(a) through 5(d).

Figure 5A:
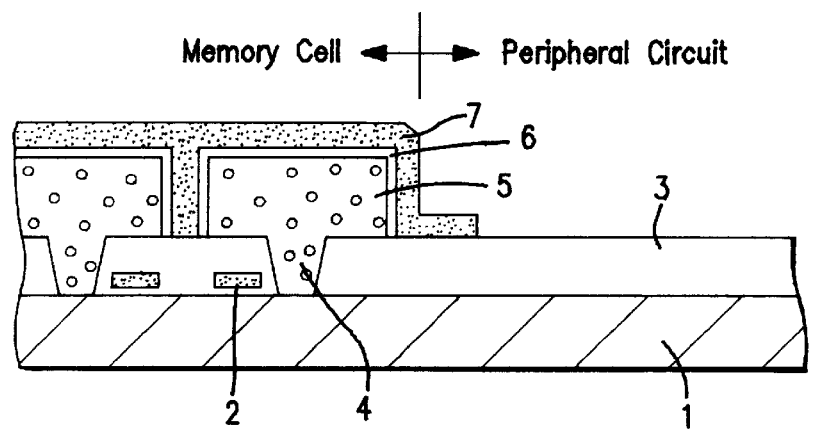
FIGS. 5(a) through 5(d) are fragmentary cross-sectional views showing a process of manufacturing the semiconductor device according to the first embodiment of the present invention.

A CMOS transistor is formed on a p-type silicon substrate 1 in the same manner as with the conventional process for fabricating general semiconductor devices. After the CMOS transistor is formed, a first interlayer insulating film 3 of $SiO_2$ is deposited to a thickness of about 400 nm on the surface formed so far according to CVD as shown in FIG. 5(a). Thereafter, a capacitance contact hole 4 is opened in the cell node of the DRAM device according to photolithography and dry etching. Then, a polysilicon film is grown to a thickness of about 500 nm on the interlayer insulating film 3 according to low-pressure CVD, and then patterned according to photolithography and dry etching.

Then, in a diffusion furnace, the polysilicon film is doped with phosphorus at a concentration of about $10^{19}$ $c^{-3}$ in the atmosphere of a POCL3 gas to produce a capacitive lower electrode 5 of conductive polysilicon. Then, an $Si_3N_4$ film is grown to a thickness of about 6 nm on the entire surface and oxidized in a steam atmosphere at 900° C., thus forming a highly leakage-resistant capacitive insulating film 6. Thereafter, a film of polysilicon is grown to a thickness of about 300 nm on the $Si_3N_4$ film according to low-pressure CVD, and then doped with phosphorus at a concentration of about $10^{19}$ $cm^{-3}$ to produce an n-type polysilicon film in the same manner as with the capacitive lower electrode 5. Then, the n-type polysilicon film is patterned into a plate electrode 7 according to photolithography and dry etching. At this time, the step between the memory cell area and the peripheral circuit area has a height of 800 nm or greater.

Figure 5B:
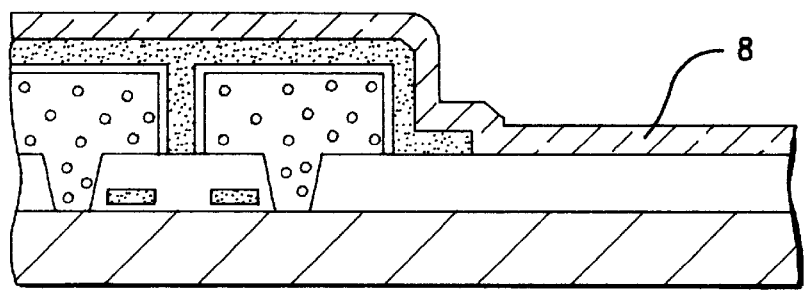
Figure 5C:
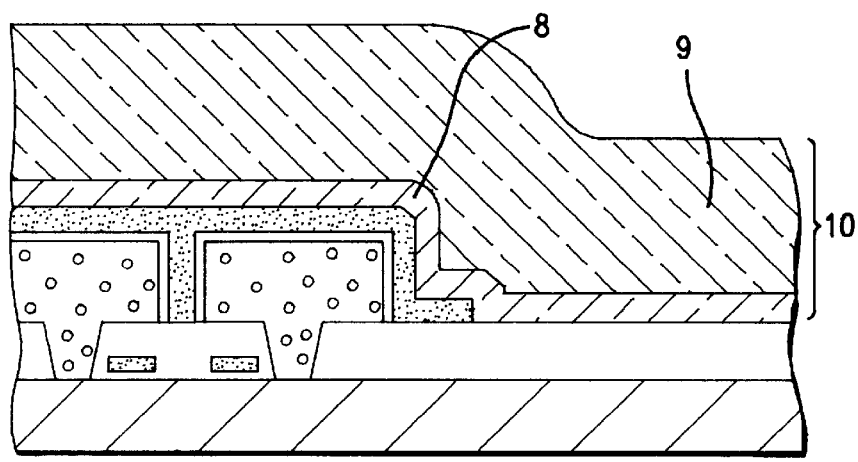
Figure 5D:
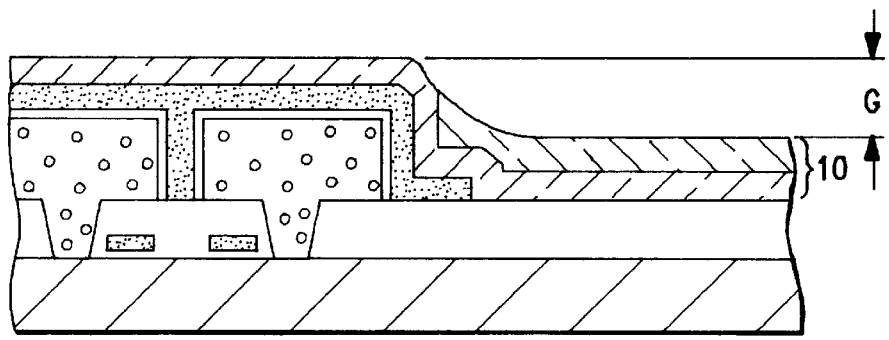

Then, as shown in FIG. 5(b), an NSG film 8 is grown to a thickness of about 600 nm on the surface formed so far according to low-pressure CVD or atmospheric-pressure CVD, and then annealed for hardening at 850° C. for 20 minutes in an N2 atmosphere. Then, as shown in FIG. 5(c), a BPSG film 9 is grown to a thickness of about 1.0 ($\mu$m on the surface formed so far according to low-pressure CVD of atmospheric-pressure CVD, and then annealed for reflow at 900° C. for 10 minutes in an $N_2$ atmosphere.

The BPSG film 9 and the NSG film 8 are then polished by a CMP device until an NSG film having a thickness of about 400 nm is left on the storage capacitor. In the memory cell area, the BPSG film 9 is polished by a thickness of 1.0 $\mu$m, and the NSG film 8 is polished by 200 nm.

Generally, the polishing rate depends on the polishing pad, the slurry, the pressure, and the rotational speed of the CMP device. If these conditions are constant, then the polishing rate differs with the material of the insulating film to be polished. In the illustrated embodiment, the polishing rate of the BPSG film is about two times greater than the polishing rate of the NSG film.

Therefore, when the NSG film starts being polished, the step, which has been of about 200 nm, between the memory cell area and the peripheral circuit area increases again, and becomes large as the polishing process progresses. When the NSG film is polished until its remaining thickness on the plate electrode becomes 400 nm, i.e., when the NSG film is polished by 200 nm, since the BPSG film is polished by about 400 nm in the peripheral circuit, the step G between the memory cell area and the peripheral circuit area has a desired dimension of 400 nm (see FIG. 5(d)).

Subsequently, an interconnection contact hole 11 having a diameter of about 0.6 $\mu$m is opened at a desired position in the peripheral circuit area according to photolithography and dry etching. Since the interconnection contact hole 11 has a depth of about 1.2 $\mu$m, its aspect ratio is about 2.0, which is a considerably improved value as compared with the aspect ratio of 2.7 of the conventional process. Then, an aluminum layer is deposited by sputtering and thereafter patterned according to photolithography and dry etching, producing an aluminum interconnection 12. The DRAM device is thus manufactured as shown in FIG. 4.

Figure 6:
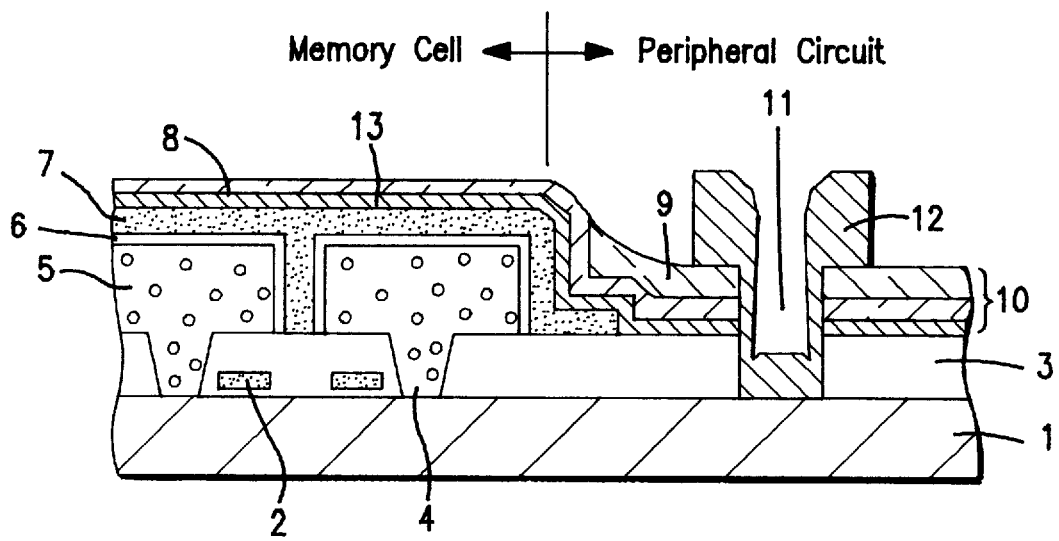
FIG. 6 is a fragmentary cross-sectional view of a semiconductor device according to a second embodiment of the present invention.

FIG. 6 of the accompanying drawings shows a DRAM device as a semiconductor device according to a second embodiment of the present invention. The DRAM device according to the second embodiment differs from the DRAM device according to the first embodiment in that a second interlayer insulating film 10 is of a three-layer film configuration comprising an $SiO_2$ film 13, an NSG film 8, and a BPSG film 9 in a peripheral circuit area, and is of a two-layer film configuration comprising the $SiO_2$ film 13 and an NSG film 7 on the storage capacitor.

The DRAM device shown in FIG. 6 is manufactured in the same manner as with the DRAM device shown in FIG. 4 up to the formation of the plate electrode 7. After the plate electrode 7 is formed, a dense $SiO_2$ film 13 is grown to a thickness of about 200 nm on the plate electrode 7 and the first interlayer insulating film 3. Then, an NSG film 8 and a BPSG film 9 are grown respectively to a thickness of 400 nm and a thickness of 1 $\mu$m. Thereafter, the films are polished by CMP, an interconnection contact hole is opened, and an aluminum interconnection 12 is formed in the same manner as with the DRAM device according to the first embodiment. The DRAM device is thus manufactured as shown in FIG. 6.

In the above embodiments, the NSG film may be replaced with an $Si_3N_4$ film, and the BPSG film may be replaced with a BSG film or a PSG film. The principles of the present invention are applicable to not only the DRAM device but also other memories and general semiconductor devices.

As described above, the semiconductor device according to the present invention includes an interlayer insulating film of a double-layer film configuration which comprises two films having different CMP polishing rates, respectively, and the interlayer insulating film is planarized by CMP. The semiconductor device according to the present invention offers the following advantages:

(1) The absolute step between the memory cell area and the peripheral circuit area can easily be controlled by varying the materials and thicknesses of the two insulating films to be polished. It is possible to fabricate the semiconductor device in a manner to satisfying optimizing conditions with respect to the absolute step which is related to a trade-off between the ease with which metal interconnections are formed in the memory cell and peripheral circuit areas and the step coverage of the interconnection material in the contact hole.

(2) Since the aspect ratio of the contact hole in the peripheral circuit area is improved, the step coverage is improved, the interconnection becomes more reliable, and the semiconductor device can be manufactured in better yields.

(3) If a barrier metal layer is formed in the interconnection contact hole, then the barrier metal coverage at the bottom of the interconnection contact hole layer is sufficient to prevent the silicon and the interconnection material (or plug material) from being diffused into each other, a condition which would otherwise take place if the thickness of the barrier metal layer were insufficient or the barrier metal layer suffered dropouts. Therefore, it is possible to prevent joint leakage from occurring due to such mutual diffusion.

Although certain preferred embodiments of the present invention have been shown and described in detail, it should be understood that various changes and modifications may be made therein without departing from the scope of the appended claims.

What is claimed is:

1. A semiconductor device comprising:

a first area of the semiconductor device with a component having a height, said first area including a first insulating layer atop the component that has a topmost first interlayer film whose top surface is at a first level;

a second area of the semiconductor device that is free of a component having a height, said second area including a second insulating layer with a second interlayer film atop said first interlayer film, a top surface of said second interlayer film being at a second level lower than said first level, said second interlayer film having a chemical mechanical polishing rate higher than that of said first interlayer film; and a contact hole in said second area that extends downward from said second level through said first and second interlayer films into contact with a conductive layer beneath said second insulating layer, said contact hole having its interior periphery covered with an electrically conductive interconnect material, said interconnect material extending above said contact hole to at least said first level, wherein an aspect ratio of said contact hole is reduced from that if said hole were extended downward from said first level.

2. A semiconductor device according to claim 1, wherein said first interlayer film is made of silicon oxide undoped with an impurity, and said second inter-layer film is made of silicon oxide doped with at least one of boron and phosphorus.

3. The device of claim 1, wherein a difference in height between said first and second levels is a function of a difference in the chemical mechanical polishing rates of said first and second interlayer films.

4. The device of claim 1, wherein the semiconductor device is a DRAM, and wherein said first area is a memory area having stacked-type capacitors and said second area is a peripheral circuit.

5. A DRAM comprising:

a memory area with a stacked-type capacitor having a height, said memory area including a first insulating layer atop the capacitor that has a topmost first interlayer film whose top surface is at a first level;

a peripheral circuit that is free of a component having a height, said peripheral circuit including a second insulating layer with a second interlayer film atop said first interlayer film, a top surface of said second interlayer film being at a second level lower than said first level, said second interlayer film having a chemical mechanical polishing rate higher than that of said first interlayer film; and a contact hole in said peripheral circuit that extends downward from said second level through said first and second interlayer films into contact with a conductive layer beneath said second insulating layer, said contact hole having its interior periphery covered with an electrically conductive interconnect material, said interconnect material extending above said contact hole, wherein an aspect ratio of said contact hole is reduced from that if said hole were extended downward from said first level, and, wherein said first interlayer film is NSG and said second interlayer film is BPSG.

6. The device of claim 5, wherein said first and second levels are separated by about 0.4 $\mu$m.

7. A DRAM comprising:

a memory cell area with stacked-type capacitors having a height, said memory cell area including a first insulating layer atop said capacitors that has a topmost NSG film whose top surface is at a first level;

a peripheral circuit area that is free of a component having a height, said peripheral circuit area including a second insulating layer with a BPSG film atop said NSG film, a top surface of said NSG film being at a second level lower than said first level, a contact hole in said peripheral circuit area that extends downward from said second level through said NSG and BPSG films into contact with a conductive layer beneath said second insulating layer, said contact hole having its interior periphery covered with an aluminum interconnect, said interconnect extending above said contact hole to said first level, wherein an aspect ratio of said contact hole is reduced from that if said hole were extended downward from said first level.

8. The DRAM of claim 7, wherein a difference in height between said first and second levels is a function of a difference in the chemical mechanical polishing rates of said NSG and BPSG films.

* * * * *